United States Patent [19]

Chen et al.

[11] Patent Number: 6,036,876
[45] Date of Patent: *Mar. 14, 2000

[54] DRY-ETCHING OF INDIUM AND TIN OXIDES

[75] Inventors: Jie Chen, Cupertino; Yuen-Kui Wong, Fremont, both of Calif.

[73] Assignee: Applied Komatsu Technology, Inc., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/881,950

[22] Filed: Jun. 25, 1997

[51] Int. Cl.$^7$ ....................................................... B44C 1/22
[52] U.S. Cl. ................................ 216/67; 216/23; 216/60; 216/76; 438/720; 438/722; 438/742
[58] Field of Search .................................. 216/41, 60, 67, 216/76, 23, 24; 438/720, 722, 742

[56] References Cited

U.S. PATENT DOCUMENTS

| | | | |
|---|---|---|---|
| 4,708,766 | 11/1987 | Hynecek | 438/722 |
| 5,318,664 | 6/1994 | Saia et al. | 216/76 X |
| 5,607,602 | 3/1997 | Su et al. | . |
| 5,667,631 | 9/1997 | Holland et al. | . |

FOREIGN PATENT DOCUMENTS

0608931 A2   8/1994   European Pat. Off. . .

OTHER PUBLICATIONS

Shih, A.H. et al., "Transformer Coupled Plasma Etching for FPD Manufacturing", Sold State Technology, vol. 39, No. 5, May 1, 1996, pp. 71,72, 74, 76, 78, 80.

Maguire, P. et al., "High–Resolution Patterning of Thin–Film Transparent Conductors By Dry Etching", Proceedings of the SID, vol. 32, No. 3, 1 Jan. 1991, pp. 197–199.

Takabatake et al., "Indium Tin Oxide Dry Etching Using HBr Gas for Thin–Film Transistor Liquid Crystal Displays", J. Electrochem Soc., vol. 142, pp. 2470–2473 (Jul. 1995).

L.Y. Tsou, "Reactive Ion Etching of Indium Tin Oxide with Hydrogen Bromide", J. Electrochem Soc., vol. 140, pp. 2965–2969 (Oct. 1993).

H. Nonaka et al., "Dry–Etching of ITO Film Using HI Gas for Manufacturing AMLCD", Tel Engineering Limited, Tokyo Japan, pp. 87–88.

Michael Barnes et al., "A New Dry Etch Technology for Large Area FPD Manufacturing", pp. 83–84.

R.J. Saia, "Selective Reactive Ion Etching of Indium–Tin Oxide in a Hydrocarbon Gas Mixture", J. Electrochem. Soc., vol. 138, pp. 493–496 (Feb. 1991).

C. Cheng et al., "Mechanism for Anisotropic Etching of Photoresist–Masked, Polycrystalline Silicon in HBr Plasmas", J. Vac. Sci. Tech. B., vol. 14, pp. 85–90 (Jan./Feb. 1996).

"Fundamentals of Dry Etching of Indium Tin Oxide Thin Film", Yue Kuo, IBM T.J. Watson Research Center, Yorktown Heights, NY, pp. 9–26 (Dec. 1996).

*Primary Examiner*—William Powell
*Attorney, Agent, or Firm*—Fish & Richardson

[57] ABSTRACT

An etch method includes providing a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is substantially greater than zero but less than 100% and where the sum x+y fills the remainder of the 100%, and a mixture of the preceding ones of the group members. A reactive gas including a halogen-containing compound and an oxygen-containing compound is supplied to a vicinity of the material layer. Also, an electric field is supplied to react the supplied reactive gas with the material layer so as to form volatile byproducts of reactive gas and the material layer.

15 Claims, 1 Drawing Sheet

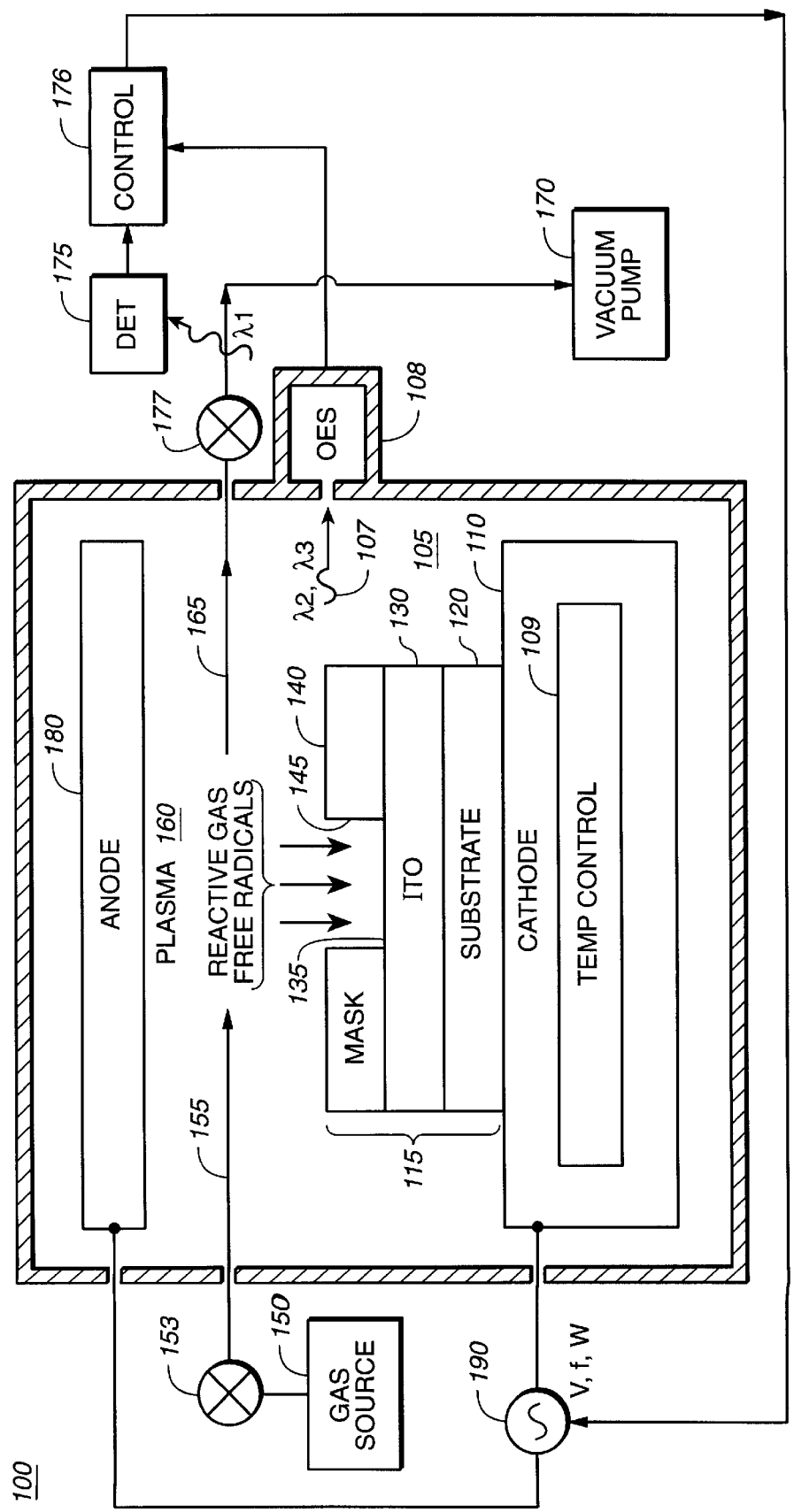
FIG._1

DRY-ETCHING OF INDIUM AND TIN OXIDES

RELATED APPLICATIONS

This application is related to the applications listed below which are being filed on the same date and assigned to the same assignee as the present invention. The applications listed below are incorporated herein by reference in their entirety:

(1) "DRY-ETCHING OF INDIUM AND TIN OXIDES," by Jie Chen, Haruhiro Goto, Marc Michael Kollrack, Kai-An Wang, Yuen-Kui Wong and Tzy-Chung Wu, U.S. Ser. No. 08/881,323; and (2) "DRY-ETCHING OF THIN FILMS LAYERS," by Jie Chen, Haruhiro Goto, Marc Michael Kollrack, Carl Sorensen, John White, Yuen-Kui Wong and Tzy-Chung Wu, U.S. Ser. No. 08/881,324.

BACKGROUND OF THE INVENTION

The invention relates generally to dry etching of indium and tin oxides.

The manufacture of a flat glass panel display, for example, typically begins with a clean glass substrate. Transistors are formed on the flat panel using film deposition and selective etching techniques. Sequential deposition, photolithography and selective etching of film layers on the substrate create individual transistors on the substrate. These devices, as well as metallic interconnections, liquid crystal cells and other devices formed on the substrate are then used to create active matrix display screens on the substrate to create a flat panel display in which display states are electrically created in the individual pixels.

Opto-electronic devices such as liquid crystal displays (LCD's), charge coupled sensor devices (CCD's) and the like often include thin-film transparent electrodes disposed over a light transmitting or light receiving element.

The transparent electrodes are typically composed of an oxide of indium (InO) or an oxide of tin (SnO) or a mixture of these oxides or a compound having the general formulation: $In_xSn_yO_z$, where the z factor is greater than zero but less than 100% and where the sum x+y fills the remainder of the 100%. The formulation, $In_xSn_yO_z$ is commonly known in the art as ITO.

During manufacture, a thin-film of the material making up the transparent electrodes is deposited on a substrate. The thin-film is thereafter selectively etched so as to remove pre-specified portions and thereby define a desired wiring pattern.

It is generally desirable in mass-production situations to etch the transparent-electrode thin-film in such a way that the etching does not significantly damage any underlying structures.

It is also generally desirable to perform the etch as quickly as possible and with as few steps as necessary in order to reduce mass-production complexity and costs.

Until recently, one common method for selectively etching ITO was to wet etch through a photolithographically patterned mask using chemically-reactive aqueous agents such as ferric chloride ($FeCL_3$)

Wet etching, however, has drawbacks. It tends to leave a liquid residue, which often must be removed prior to further processing. The removal of residue complicates the overall process and increases costs.

Another drawback of wet etching is that its material removal rate tends to be highly sensitive to temperature variations. Tight temperature control, which also complicates the overall process and increases costs, is needed to compensate and prevent over or under etching. "Under etching" refers to the condition where the transparent-electrode thin-film is not etched through thoroughly and undesired shorts appear in the resultant conductor pattern. "Over etching" refers to the condition where the transparent-electrode thin-film is etched through thoroughly and undesired etching of the underlying substrate begins and/or time and resources are wasted in trying to etch to a depth beyond that needed.

Yet a further drawback of wet etching is that it is isotropic. Over etching may lead to undesired undercutting beneath the etch mask. The undercutting may be so extensive that it leads to unintended open circuits in the conductor pattern.

More recently, attempts have been made to overcome the problems of wet etching by dry etching the material layer of the thin-film transparent electrodes with an anisotropic reactive plasma.

SUMMARY OF THE INVENTION

In general, in one aspect, the invention features an etch method which includes providing a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is substantially greater than zero but less than 100% and where the sum x+y fills the remainder of the 100%, and a mixture of the preceding ones of the group members. A reactive gas including a halogen-containing compound and an oxygen-containing compound is supplied to a vicinity of the material layer. Also, an electric field is supplied to react the supplied reactive gas with the material layer so as to form volatile byproducts of reactive gas and the material layer.

In various implementations, the invention includes one or more the following features. The supplied reactive gas can include one or more of hydrogen bromide (HBr), hydrogen iodide (HI) or hydrogen chloride (HCl). The supplied reactive gas can also include $O_2$ or $H_2O$. The relative amount(s) of the oxygen-containing compound(s) can be selected to provide a more selective etch of the material layer with respect to a substrate layer supporting the material layer.

A mask layer having one or more apertures defined through the mask layer can be provided over the material layer to expose corresponding one or more surface portions of the material to products of the reactive gas and the applied electric field.

In various implementations, a substrate is provided below the material layer, and it is determined when the etch process etches through the material layer to the substrate. The etch process can then be halted at or about the time it is determined that the etch process has etched through the material layer to the substrate.

In various implementations, the invention features one or more of the following advantages. The addition of an oxygen-containing compound to the reactive gas can improve the selectivity of the ITO etch with respect to the etching of the substrate layer. The increased selectivity obtained by the addition of the oxygen-containing compound to the reactive gas allows one to over-etch the ITO layer somewhat to provide a more uniform etch across the surface of the material layer.

The addition of an oxygen-containing compound to the reactive gas can also provide a broader process window which is relatively insensitive to variations in other process parameters such as pressure, power or RF frequency. Similarly, the precise time at which the etch process is halted based upon emission spectra detected during the etch process can be permitted to vary somewhat without significantly changing the overall etch results. This can be particularly important for mass production facilities where these other parameters may be varied intentionally or may vary over time due to other manufacturing conditions.

BRIEF DESCRIPTION OF THE DRAWING

FIG. 1 is a cross-sectional schematic of a reactive ion etch (RIE) system for carrying out a dry etch process in accordance with the invention.

DESCRIPTION OF THE PREFERRED EMBODIMENTS

FIG. 1 schematically shows in cross-section a reactive ion etch (RIE) system 100. A more detailed mechanical description of the basic etching apparatus may be found in U.S. application Ser. No. 08/273,382, filed Jul. 7, 1994 (now U.S. Pat. No. 5,743,133) by Wong et al., entitled "METHOD AND APPARATUS FOR ETCHING FILM LAYERS ON LARGE SUBSTRATE," assigned to the assignee of the present invention, and incorporated by herein reference in its entirety.

System 100 includes a substrate-supporting cathode 110 that is spaced-apart from an opposed anode 180 within a low-pressure chamber 105. The anode 180 may be a discrete element as shown or it may be defined by one or more of the inner walls of the etch chamber 105 rather than being a separate element. In one implementation, the inner walls of the chamber define the anode, and the cathode is placed centrally within the chamber so that multiple faces of the cathode oppose corresponding inner walls of the chamber. The latter implementation allows for the simultaneous etch of two or more workpieces in one chamber.

A radio frequency (RF) generator 190 is coupled electrically to the cathode 110 and anode 180 for producing an RF field between the opposed faces of the cathode and anode. The RF field may be of a single frequency or multiple frequencies.

A gas supply 150, which can include a gas container or gas tank, is operatively coupled to the low-pressure chamber 105 for supplying a reactive gas 155 into the chamber 105. The reactive gas 155 includes at least one member from a first group consisting of compounds which include hydrogen and a halogen, and at least one member from a second group consisting of water vapor ($H_2O$) and oxygen ($O_2$). Examples of compounds in the first group include hydrogen bromide (HBr), hydrogen iodide (HI) and hydrogen chloride (HCl). The flow rate of the supplied reactive gas 155 should be approximately 100 to 200 standard cubic centimeters (sccm), although higher or lower flow rates may be desirable in certain implementations.

A flow-rate control device 153, such as a valve, is provided for regulating the inflow rate of the reactive gas 155 so as to maintain a desired level of inflow (e.g., 100 sccm which is the flow of gas which fills up per minute a volume of 100 cc to a pressure of 1 atmosphere at 0° C.). Usually there is no inert carrier gas such as argon, helium or nitrogen in the input gas stream because more work is needed to exhaust this additional material to maintain low pressure. However, one may use one or more such inert gases as a carrier for the reactive gas 155 if desired.

A pressure regulator 177 is provided along the exhaust path of vacuum pump 170 for maintaining a desired pressure level within chamber 105.

A workpiece 115, which has a transparent-electrode material layer 130 to be etched, is mounted on the cathode 110. The workpiece 115 can include a substrate 120 onto which the transparent-electrode material layer 130 is deposited. The substrate 120 may be composed of one or more layers of materials such as glass ($SiO_2$), silicon nitride ($Si_3N_4$), amorphous silicon (a-Si), poly or mono-crystalline silicon (p-Si or Si), or other materials as may be suitable for a specific opto-electronic application.

The transparent-electrode material layer 130 can be a thin-film having a thickness of 1500 angstroms or less and comprising ITO, an indium oxide, a tin oxide or a mixture of these oxides. The material layer 130 can also include a compound of indium and of tin and of oxygen having the general formulation $In_xSn_yO_z$ where z is substantially greater than zero but less than 100% and where the sum x+y fills the remainder of the 100%. As previously noted, the formulation, $In_xSn_yO_z$ is commonly known in the art as ITO.

A pre-patterned mask 140 that has been formed by photolithography or other suitable techniques is provided about the material layer 130 which is to be etched. The mask 140 has one or more apertures 145 defined therethrough for exposing a surface portion 135 of the transparent-electrode material layer 130. Unexposed portions of material layer 130 are protected from etching by the material of the mask 140. The mask 140 can be composed of materials such as a photoresist deposited to a thickness of 1.5 µm.

The chamber 105 is sealed to maintain pressures at a desired level in the vicinity of the workpiece 115. The vacuum pump 170 is operated to exhaust gases from the chamber 105 and to create the desired pressure within the chamber.

The RF generator 190 is activated by an etch-controller 176 to provide an oscillating electric field between the cathode 110 and anode 180 for etching through the exposed portion of material layer 130 in a single step and stopping after etch-through has been achieved.

The frequency (f) of the generated RF field is in the range of approximately 400 kilohertz (kHz) to 13.56 megahertz (MHz). A combination of approximately 13.56 MHz for plasma creation and approximately 400 kHz for ion acceleration can be used. The combined multiple frequencies can be developed by separate oscillators. The lower frequency field is often developed so as to predominate in the vicinity of the substrate-supporting cathode 110 and is referred to as the pedestal RF. The higher frequency field is often developed so as to predominate in the vicinity of the plasma 160 above the workpiece 115 and is referred to as the plasma RF.

The power density (W) of the applied RF field is typically in the vicinity of approximately 0.5 watt per centimeter squared (0.5 W/cm$^2$) as measured relative to the exposed surface area 135 of material layer 130. However, higher or lower power densities can be used depending on the particular application. In general, the etch rate tends to increase at higher power densities. However, at higher power densities, photoresist can become more difficult to remove following the dry etch.

The intensity (volts/cm) of the RF field is sufficiently large to disassociate the next-described reactive gas 155 into atomic constituents (free radicals). In one embodiment, a field intensity in the range of 300 to 800 volts/cm is created in the vicinity of the exposed surface portion 135 of material layer 130.

A temperature controller 109, such as a fluid-cooled heat exchanger, is coupled to the cathode 110 to maintain the temperature of the cathode in the range of approximately 5 to 80° C. The temperature of the substrate 120 should be maintained at approximately 120° C. or less, and preferably at 100° C. or less to prevent damage to the films on the substrate 120. The temperature of the substrate 120 is determined by thermal transfer through the cathode 110 to the temperature controller 109. The temperature of the plasma 160 that forms in the vicinity of the surface portion 135 can be significantly higher and tends to be sporadic as the plasma fluctuates.

A spectroscopic analyzer 175 is provided along the exhaust path of the vacuum pump 170 for optically scanning the exhaust gases 165, analyzing the results and thereby determining the chemical composition of the exhaust gases 165. The spectroscopic analyzer 175 is designed to distinguish between exhaust gases 165 that do or do not contain one or more compounds in the by-product group including: water vapor ($H_2O$), indium iodides ($In_xI_y$), tin iodides ($Sn_xI_y$), indium bromides ($In_xBr_y$), tin bromides ($Sn_xBr_y$), indium chlorides ($In_xCl_y$), tin chlorides ($Sn_xCl_y$) and tin hydrides ($Sn_xH_y$). The following TABLE-1 lists some of the chemical reactions that are believed to occur between the freed constituents H*, Br* and I*, and In, Sn and O to produce volatile by-products. The symbol * indicates that the radical may be charged or uncharged.

TABLE 1

| 1st Reactant | 2nd Reactant | Volatile By-products |
|---|---|---|
| Br* | In | $InBr$, $InBr_3$ |
| Br* | Sn | $SnBr_4$ |
| I* | In | $InI$, $InI_3$ |
| I* | Sn | $SnI_4$ |
| Cl* | In | $InCl$, $InCl_3$ |
| Cl* | Sn | $SnCl_4$, $SnCl_2$ |
| H* | Sn | $SnH_4$ |
| H* | O | $H_2O$ |

In one implementation, the spectroscopic analyzer 175 includes an optical detector that is sensitive in the visible light range of $\lambda 1$ equal to approximately 450 to 452 nanometers.

The spectroscopic analyzer 175 is coupled to the etch-controller 176 that turns off the RF generator 190 and thereby halts the etch process when the analyzer 175 indicates that effective etch-through has been achieved.

The term 'effective etch-through' is used here to mean the condition when etching has progressed sufficiently far into the transparent-electrode layer so that a useable wiring pattern is created in the transparent-electrode layer without leaving behind undesired shorts or low resistance paths between conductors of that layer that are to be electrically isolated from one another.

A second spectroscopic detector, referred to as an OES (Optical Emission Spectroscope) 108, can be installed approximately in line with the workpiece surface so as to detect a plasma induced light emission $\lambda 2$ of indium (In) or tin (Sn) approximately in a plane 107 of surface portion 135. The OES 108 is coupled to the etch-controller 176 so as to turn off the RF generator 190 and thereby halt the etch process when effective etch-through is indicated to have been reached by an empirically-determined reduction in $\lambda_2$ emissions of In or Sn in the plane 107.

The OES 108 has a faster response time than the exhaust spectroscopic analyzer 175 because the OES 108 does not wait for exhaust gases to reach it. When used in combination with the OES 108, the exhaust spectroscopic analyzer 175 may be used to verify readings obtained from the OES 108 to assure that the OES 108 is operating correctly before plasma shut-off occurs.

Another way that the time point of effective etch-through of material layer 130 can be determined is by looking for peaks in a plasma induced light emission $\lambda 3$ of hydrogen (H), chlorine (Cl), bromine (Br) and/or iodine (I) approximately in the plane 107 of the surface portion 135. While there is still In or Sn available for reaction with and consumption of H, Cl, Br and/or I in the vicinity surface portion 135, the concentration of H, Cl, Br and/or I remains diminished in this vicinity. However, once effective etch-through has been achieved, there is a substantial decrease in the In or Sn available for reaction with H, Cl, Br and/or I, and a concentration peak shows in the wavelengths of H, Cl, Br and/or I. The RF generator 190 can be turned off in response to the detection of such a peak in the monitored wavelengths of H, Cl, Br and/or I to thereby halt the etch process at the point of etch-through.

Alternately, the combination of H, Cl, Br and/or I emission peaks, and In and/or Sn emission minima may be used to determine the time point for turning off RF generator 190.

In yet another variation, if the material of the substrate 120 is susceptible to etching by H, Cl, Br and/or I radicals, then OES 108 can also be used to detect a plasma-induced light emission by the released constituents of the substrate 120 as etch-through is achieved. The detection of this event may also be used to determine the appropriate time to turn off the RF generator 190.

TABLE-2 shows some experimental results obtained for the case where the material layer 130 consists essentially of ITO on a substrate 120 of SiN. The sample size was approximately 550 mm by 650 mm. The RF generator 190 was set to a single frequency of 13.56 MHz for both the pedestal and the plasma. The lower power level was set to define a power density of about 0.56 $W/cm^2$ relative to the exposed surface 135 of the ITO layer 130. The total flow of the reactive gas was approximately in the range 100–300 sccm, and the pressure in the chamber was approximately in the range 5–50 milliTorr (mTorr). In addition, the flow of argon gas was approximately in the range 0–300 sccm. In TABLE-2, the selectivity is defined as the ratio of the etch rate of the ITO layer 130 to the etch rate of the substrate 120.

TABLE 2

| Reactive Gas | Percentage Oxygen | Selectivity (ITO:Substrate) |
|---|---|---|
| $HCl + O_2$ | 0 | 0.7 |
| $HCl + O_2$ | 30 | 1.7 |
| $HCl + O_2$ | 50 | 3.0 |
| $HBr + O_2$ | 0 | 0.9 |
| $HBr + O_2$ | 9 | 1.5 |
| $HBr + O_2$ | 18 | 4.1 |

In general, the etch rate obtained using a reactive gas consisting essentially of a mixture of a halogen-containing compound and $O_2$ was somewhat less than the etch rate obtained using a reactive gas consisting essentially of the halogen-containing compound alone. However, as shown by the data in TABLE-2, the use of a reactive gas consisting essentially of a mixture of a halogen-containing compound and $O_2$ improved the selectivity of the etch when compared to the selectivity obtained using a reactive gas consisting essentially of the halogen-containing compound alone. The increased selectivity obtained by the addition of $O_2$ to the reactive gas allows one to over-etch the ITO layer 130 somewhat to provide a more uniform etch across the surface of the workpiece 115.

In some applications, $H_2O$ can be used instead of or in addition to $O_2$. The addition of $O_2$ or $H_2O$ to the reactive gas 155 can also provide a broader process window which is relatively insensitive to variations in other process parameters such as pressure, power or RF frequency. This can be particularly important for mass production facilities where these other parameters may be varied intentionally or may vary over time due to other manufacturing conditions.

Other implementations are contemplated within the scope of the following claims.

What is claimed is:

1. An etch method comprising:

providing a material layer consisting essentially of a group member selected from the group consisting of an indium oxide (InO), a tin oxide (SnO), a mixture of indium and tin oxides, a compound of indium and of tin and of oxygen having the general formulation $In_xSn_yO_z$ where z is substantially greater than zero but less than 100% and where the sum x+y fills the remainder of the 100%, and a mixture of the preceding ones of said group members;

supplying a reactive gas including a halogen-containing compound and an oxygen-containing compound to a vicinity of the material layer; and supplying an electric field to react the supplied reactive gas with the material layer so as to form volatile byproducts of reactive gas and the material layer.

2. The etch method of claim 1 wherein the supplied reactive gas comprises hydrogen bromide (HBr).

3. The etch method of claim 1 wherein the supplied reactive gas comprises hydrogen iodide (HI).

4. The etch method of claim 1 wherein the supplied reactive gas comprises hydrogen chloride (HCl).

5. The etch method of claim 1 wherein the supplied reactive gas comprises $O_2$.

6. The etch method of claim 1 wherein the supplied reactive gas comprises $H_2O$.

7. The etch method of claim 1 wherein the supplied reactive gas comprises hydrogen bromide (HBr) and $O_2$.

8. The etch method of claim 1 wherein the supplied reactive gas comprises hydrogen bromide (HBr) and $H_2O$.

9. The etch method of claim 1 wherein the supplied reactive gas comprises hydrogen iodide (HI) and $O_2$.

10. The etch method of claim 1 wherein the supplied reactive gas comprises hydrogen iodide (HI) and $H_2O$.

11. The etch method of claim 1 wherein the supplied reactive gas comprises hydrogen chloride (HCl) and $O_2$.

12. The etch method of claim 1 wherein the supplied reactive gas comprises hydrogen chloride (HCl) and $H_2O$.

13. The etch method of claim 1 wherein the relative amount of the oxygen-containing compound is selected to provide a more selective etch of the material layer with respect to a substrate layer supporting the material layer.

14. The etch method of claim 1 further comprising:

providing a mask layer over the material layer, the mask layer having one or more apertures defined through the mask layer for exposing corresponding one or more surface portions of the material to products of the reactive gas and the applied electric field.

15. The etch method of claim 1 further comprising:

providing a substrate below the material layer;

determining when the etch process etches through the material layer to the substrate; and halting the etch process at or about the time it is determined that the etch process has etched through the material layer to the substrate.

* * * * *